US008088547B2

(12) United States Patent
Hu et al.

(10) Patent No.: US 8,088,547 B2
(45) Date of Patent: Jan. 3, 2012

(54) RESIST COMPOSITION

(75) Inventors: Sanlin Hu, Midland, MI (US); Sina Maghsoodi, Midland, MI (US); Eric Scott Moyer, Midland, MI (US); Sheng Wang, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 881 days.

(21) Appl. No.: 11/665,506

(22) PCT Filed: Sep. 20, 2005

(86) PCT No.: PCT/US2005/033541
§ 371 (c)(1),
(2), (4) Date: Apr. 13, 2007

(87) PCT Pub. No.: WO2006/049720
PCT Pub. Date: May 11, 2006

(65) Prior Publication Data
US 2007/0264587 A1 Nov. 15, 2007

Related U.S. Application Data

(60) Provisional application No. 60/624,319, filed on Nov. 2, 2004.

(51) Int. Cl.
*G03C 1/00* (2006.01)
*G03F 1/00* (2006.01)
*C08G 77/00* (2006.01)
*C08G 77/12* (2006.01)
(52) U.S. Cl. .......... 430/270.1; 430/322; 528/10; 528/31
(58) Field of Classification Search ............... 430/270.1; 528/31, 10
See application file for complete search history.

(56) References Cited

U.S. PATENT DOCUMENTS

| | | | |
|---|---|---|---|
| 3,615,272 A | 10/1971 | Collins et al. | |
| 4,999,397 A | 3/1991 | Weiss et al. | |
| 5,010,159 A | 4/1991 | Bank et al. | |
| 5,045,592 A | 9/1991 | Weiss et al. | |
| 5,063,267 A | 11/1991 | Hanneman et al. | |
| 5,085,893 A | 2/1992 | Weiss et al. | |
| 5,290,899 A | 3/1994 | Tanaka et al. | |
| 5,385,804 A | 1/1995 | Premlatha et al. | |
| 5,399,462 A | 3/1995 | Sachdev et al. | |
| 5,416,190 A | 5/1995 | Mine et al. | |
| 5,612,170 A | 3/1997 | Takemura et al. | |
| 6,087,064 A | 7/2000 | Lin et al. | |
| 6,210,856 B1 | 4/2001 | Lin et al. | |
| 6,296,985 B1 | 10/2001 | Mizutani et al. | |
| 6,303,268 B1 | 10/2001 | Namba et al. | |
| 6,319,650 B1 | 11/2001 | Gelorme et al. | |
| 6,340,734 B1 | 1/2002 | Lin et al. | |
| 6,353,074 B1 | 3/2002 | Carpenter, II et al. | |
| 6,399,210 B1 * | 6/2002 | Zhong | 428/447 |
| 2002/0081520 A1 | 6/2002 | Sooriyakumaran et al. | |
| 2002/0090572 A1 * | 7/2002 | Sooriyakumaran et al. | 430/271.1 |
| 2003/0064254 A1 * | 4/2003 | Eguchi et al. | 428/698 |
| 2003/0152784 A1 | 8/2003 | Deis et al. | |
| 2003/0191267 A1 * | 10/2003 | Boisvert et al. | 528/10 |
| 2004/0143082 A1 * | 7/2004 | Iwasawa et al. | 528/25 |

FOREIGN PATENT DOCUMENTS

| | | |
|---|---|---|
| EP | 1142928 | 4/2001 |
| JP | 59-178749 | 10/1984 |
| JP | 60-86017 | 5/1985 |
| JP | 63-107122 | 5/1988 |
| JP | 10-251519 | 9/1998 |
| JP | 2004-300230 | 10/2004 |

OTHER PUBLICATIONS

Hung et al., Development of SSQ Based 157 nm Photoresist[1], Journal of Photopolymer Science and Technology, vol. 15, No. 4, 2002, 693-698.
Bowden et al., Role of Bilayer Resist in 157 nm Lithograpy, Journal of Photopolymer Science and Technology, vol. 16, No. 4, 2003, 629-636.
Hung et al., Development of SSQ Based 157 nm Photoresist, Journal of Photopolymer Science and Technology, vol. 16, No. 4, 2003, 591-594.
Trinque et al., Advances in Resists for 157 nm Microlithography, Advances in Resist Technology and Processing XIX, Theoddore H. Fedynyshyn, Editor, Proceedings of SPIE vol. 4690, 2002, 58-67.
Sooriyakumaran et al., Silicon-containing Resists for 157 nm Applications, Advances in Resist Technology and Processing XVIII, Francis M. Houlihan, Editor, Proceedings of SPIE vol. 4345, 2001, 319-326.
Ito et al., Anphatic platforms for the design of 157 nm chemically amplified resists, Advances in Resist Technology and Processing XIX, Theodore H. Fedynyshyn, Editor, Proceedings of SPIE vol. 4690, 2002, 18-28.
Fedynyshyn et al., High Resolution Fluorocarbon Based Resist for 157-nm Lithography, Advances in Resist Technology and Processing XIX, Theodore H. Fedynyshyn, Editor, Proceedings of SPIE vol. 4690, 2002, 29-40.
Fujigaya et al., A New Photoresist Material for 157 nm Lithography-2, Journal of Photopolymer Science and Technology, vol. 15, No. 4, 2002, 643-654.
Kunz et al., Outlook for 157-nm resist design, SPIE Conference on Advances in Resist Technology and Processin XVI, SPIE vol. 3678, Mar. 13-23, 1999.
Crawford et al., New Materials for 157 nm Photoresist: Characterization and Properties, Advances in Resist Technology and Processing XVII, Francis M. Houlihan, Editor, Proceedings of SPIE vol. 3999, 2000, 357-364.

\* cited by examiner

*Primary Examiner* — Cynthia Kelly
*Assistant Examiner* — Connie P Johnson
(74) *Attorney, Agent, or Firm* — Erika Takeuchi; Sharon K. Brady

(57) ABSTRACT

A resist composition comprising (A) a hydrogen silsesquioxane resin, (B) an acid dissociable group-containing compound, (C) a photo-acid generator, (D) an organic solvent and optionally (E) additives. The resist composition has improved lithographic properties (such as high etch-resistance, transparency, resolution, sensitivity, focus latitude, line edge roughness, and adhesion) suitable as a photoresist.

25 Claims, No Drawings

RESIST COMPOSITION

CROSS REFERENCE TO RELATED APPLICATIONS

This application is a U.S. national stage filing under 35 U.S.C. §371 of PCT Application No. PCT/US2005/033541 filed on 20 Sep. 2005, currently pending, which claims the benefit of U.S. Provisional Patent Application No. 60/624, 319 filed 2 Nov. 2004 under 35 U.S.C. §119 (e). PCT Application No. PCT/US2005/033541 and U.S. Provisional Patent Application No. 60/624,319 are hereby incorporated by reference.

One of the key chemicals used for IC manufacturing is photoresist, a photosensitive polymer that masks portion of substrate & transfers IC patterns w/high integrity when properly exposed & developed. Building faster & smaller processors calls for resists that meet stricter requirements: high transparency; thinner film; better adhesion; higher etch resistance & better thermal stability; faster photo-induced sensitivity. However, design and development of such materials is a significant challenge since most known photoresists, water, oxygen, and simple hydrocarbons absorb light strongly in the spectral range.

193 nm (ArF) immersion lithography and 157 nm (F2) lithography are widely investigated and rapidly emerging as viable technologies for sub-65 nm node device. Thickness of imaging layer tends to become thinner for higher resolution and larger process window. This requires developing photoresist with ultrahigh etching resistance. Although both fluorocarbon polymers and silicon-containing polymers including silsesquioxanes have shown high transparency at 157 nm, silicon containing materials, especially silsesquioxane-based resists, have an advantage of being highly resistant to plasma etch and suitable for bilayer photoresist application.

Due to its unique structure and high content of Si—H bonds, hydrogen silsesquioxane (HSQ) is remarkably transparent at both 193 nm and 157 nm. HSQ (commercialized by Dow Corning under the trade name FOX®) has been widely used as a spin-on low-k dielectric material, which already possesses certain characteristics required as a good photoresist resin, such as good thin film quality, thermal and mechanical properties. It is also believed that in the base aqueous solution (like in the commonly used developer, tetramethyl ammonium hydroxide (TMAH)), the Si—H bond is rapidly converted to Si—OH, a base soluble moiety. However, it is very difficult, if not impossible, to directly incorporate any acid-labile functional groups into the HSQ backbone to make HSQ useful as a photoresist resin. One of the methods for incorporating an acid dissociable group into the HSQ uses transition metal-catalyzed hydrosilylation reaction. However, removal of the residual catalysts is challenging.

This invention pertains to a composition suitable as a photoresist for microlithographic applications at 193 nm, 157 nm and immersion lithography. The resist composition comprises (A) a hydrogen silsesquioxane resin, (B) an acid dissociable group-containing compound, (C) a photo-acid generator, (D) an organic solvent; and (E) optionally additives. These resist compositions are transparent at low wavelengths and satisfy numerous other requirements for a photoresist such as adhesion, thermo-stability, chemically amplifiable, and aqueous-base solubility upon photo de-protection.

The hydrogen silsesquioxane resin, component (A), has the formula $(HSi(OH)O_{2/2})_w(HSi(R^1)O_{2/2})_x(HSiO_{3/2})_y(SiO_{4/2})_z$, where $R^1$ is a linear or branched $C_1$ to $C_6$ alkyl or alkoxy group; w=0 to 1, x=0 to 1, y has a value of >0 to 1, z=0 to 1 and w+x+y+z≈1. Typically w=0 to 0.1, x=0 to 0.1, z=0 to 0.1 and y=0.7 to 1 and w+x+y+z≈1.

$R^1$ may be exemplified by, but not limited to methyl, methoxy, ethyl, ethoxy, propylpropoxy, butyl, butoxy, t-butyl, t-butoxy and others. Typically $R^1$ is methyl. The hydrogen silsesquioxane resins may be fully condensed $(HSiO_{3/2})_n$ where n is 8 or greater or they may be partially hydrolyzed (i.e. containing some Si—OR) and/or partially condensed (i.e. containing some Si—OH). Although not represented by the formula, the hydrogen silsesquioxane resins may also contain a small amount (i.e. less than 10%) of silicon atoms, which have either 0, or 2 hydrogen atoms attached thereto or a small number of SiC bonds due to the various factors involved in their formation and/or handling. The hydrogen silsesquioxane resins used herein typically have an average molecular weight (Mw) of 500 to 1,000,000, alternatively 1,000 to 50,000.

Methods for preparing hydrogen silsesquioxane resins (A) are known in the art. One method involves the hydrolysis of trihalosilanes such as trichlorosilane or trialkoxysilanes such as trimethoxysilane. Another method involves sulfonation, hydrolysis, separation/acid removal, and solvent exchange/removal of trihalosilanes such as trichlorosilane. Methods for preparing hydrogen silsesquioxane resins may be found in, but are not limited to those in, U.S. Pat. No. 3,615,272 to Collins et al., U.S. Pat. No. 5,010,159 to Bank et al., U.S. Pat. No. 4,999,397 to Frye et al., U.S. Pat. No. 6,353,074 to Carpenter et al., U.S. Patent Application Publication No. 2003-0152784 and Japanese Patent Kokai Nos. 59-178749, 60-86017 and 63-107122.

Specific molecular weight fractions of the above hydrogen silsesquioxane resins may also be used in this process. Such fractions and methods for their preparation are taught in U.S. Pat. No. 5,063,267 to Hanneman et al. and U.S. Pat. No. 5,416,190 to Mine et al., which are hereby incorporated by reference. A preferred fraction comprises material wherein at least 75% of the polymeric species have a molecular weight of 1200 and above. A more preferred fraction comprises material wherein at least 75% of the polymeric species have a number average molecular weight in the range of 1,000 and 50,000.

Component (B) in the resist composition is an acid dissociable group-containing compound. By "acid-dissociable group" it is meant a molecular moiety that is cleavable with acid, particularly photogenerated acid (PAG). Acid dissociable groups are known in the art and are described, for example, in European Patent Application No. 1142928 and U.S. Patent Application Publication No. 2002/0090572, herein incorporated by reference for its teaching of acid dissociable groups. In particular, the acid dissociable groups can be described by the formula:

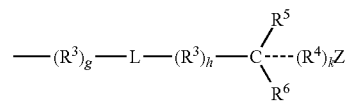

wherein each R are independently a linking group,
$R^4$ a second linking group;
L is selected from the group consisting of linear or branch alkylene groups having 1 to 10 carbon atoms, fluoroalkylene groups having 2 to 20 carbon atoms, substituted and unsubstituted arylene groups, substituted and unsubstituted cycloalkylene groups, and substituted and unsubstituted alkarylene groups;

$R^5$ is hydrogen, linear or branched alkyl or fluoroalkyl;
$R^6$ is alkyl or fluoroalkyl;
Z is an acid-cleavable group;
g may have a value of 0 or 1
h may have the value of 0 or 1; and
k may have the value of 0 or 1.

Each $R^3$ may be exemplified by, but not limited to, an alkylene group such as methylene and ethylene.

$R^4$ may be exemplified by, but not limited to, linear or branched alkylene groups, cycloalkylene groups such as norbornyl or cyclohexylene, fluoroalkylene groups, and aryl groups.

L may be exemplified by, but not limited to, substituted (e.g. fluorinated) and unsubstituted methylene, ethylene, norbornene, cycloalkylene and alkarylene moieties.

$R^5$ may be exemplified by, but not limited to hydrogen, $C_1$ to $C_6$ alkyl groups such as methyl and ethyl and $C_1$ to $C_6$ fluoroalkyl groups such as trifluoromethyl, 2,2,2-trifluoroethyl and 3,3,3-trifluoromethyl.

$R^6$ may be exemplified by, but not limited to, $C_1$ to $C_6$ alkyl groups such as methyl and ethyl and $C_1$ to $C_6$ fluoroalkyl groups such as trifluoromethyl, 2,2,2-trifluoroethyl and 3,3,3-trifluoromethyl.

Z may be exemplified by, but not limited to, —OH, —COOH, esters of the formula —COOR$^7$, carbonates of the formula —OCOOR$^8$, ethers of the formula —OR$^9$, wherein $R^7$, $R^8$ and $R^9$ are selected to render Z acid-cleavable.

In the Z group —COOR$^7$, $R^7$ may be a tertiary alkyl, e.g., t-butyl, a cyclic or alicyclic substituent (generally $C_6$-$C_{12}$) with a tertiary attachment point such as adamantyl, norbornyl, isobornyl, 2-methyl-2-adamantyl, 2-methyl-2-isobornyl, 2-butyl-2-adamantyl, 2-propyl-2-isobornyl, 2-methyl-2-tetraclododecenyl, 2-methyl-2-dihydrodicyclopentadienyl-cyclohexyl, 1-methylcyclopentyl or 1-methylcyclohexyl, or a 2-trialkyl-silylethyl group, such as 2-trimethylsilylethyl, or 2-triethylsilylethyl.

Carbonate Z groups having the formula —OCOOR$^8$ may be exemplified by —O-t-butoxycarbonyl (i.e. $R^8$ is t-butyl). Ether acid dissociable groups having the formula —OR$^9$ may be exemplified by tetrahydropyranyl ether (i.e. $R^9$ is tetrahydropyranyl) and trialkylsilyl ethers (i.e. $R^9$ is a trialkylsilyl such as trimethylsilyl).

Typical Z groups are organic ester groups that undergo a cleavage reaction in the presence of a photogenerated acid (PAG) to generate a carboxylic acid group.

Acid dissociable groups may be exemplified by, but not limited to 1,1 dimethylethyl, isopropyl, 2-methyladamantyl, 2-ethyladamantyl, cyclohexyl, and 2-hydroxy-3-pinanyl or t-butyl ester of norbornane, and others.

Acid dissociable group-containing compounds (B) may be produced by polymerizing an acid dissociable group precursor or by adding an acid dissociable group precursor to a polymer such as silsesquioxane polymers.

Acid dissociable group precursors may be exemplified by, but not limited to, t-butyl ester of norbornene, 1-methylcyclopentyl ester of norbornene, 1-methylcyclohexyl ester of norbornene, t-butyl -2-trifluoromethyl acrylate, t-butyl methacrylate, bicyclo[2,2,1]hept-5-ene-2-t-butylcarboxylate, cis-5-norbornene-2,3-dicarboxylic anhydride, 5-(2-t-butoxycarbonyl)norbornyltrichlorosilane and others.

Acid dissociable group-containing compounds (B) may be exemplified by, but not limited to poly(t-butylmethacrylate) (t-BMA) and poly(t-butoxycarbonyl norbornyl silsesquioxane)(t-BENBSQ), poly(methyl-co-t-butyloxycarbonyl norbornyl) silsesquioxane(M-co-t-BENBSQ), and poly(t-butyl-2-trifluoromethylacrylate)(t-BTFM).

The amount of (B) present in the resist composition is typically in the range of 5 to 70 parts by weight based on 100 parts by weight of (A), alternatively 20 to 50 parts by weight.

Component (C) in the composition is a photo-acid generator (PAG). The photo-acid generator is a compound that generates acid upon exposure to radiation. This acid then causes the acid dissociable group in (B) to dissociate. Photo-acid generators are well known in the art and are described in, for example, EP 1 142 928 A1. Photo-acid generators may be exemplified by, but not limited to, onium salts, halogen-containing compounds, diazoketone compounds, sulfone compounds, sulfonate compounds and others.

Examples of onium salts include, but are not limited to, iodonium salts, sulfonium salts (including tetrahydrothiophenium salts), phosphonium salts, diazonium salts, and pyridinium salts.

Examples of halogen-containing compounds include, but are not limited to, mahaloalkyl group-containing hydrocarbon compounds, haloalkyl group-containing heterocyclic compounds, and others.

Examples of diazoketone compounds include, but are not limited to, 1,3-diketo-2-diazo compounds, diazobenzoquinone compounds, diazonaphthoquinone compounds, and others.

Examples of sulfone compounds, include, but are not limited to, β-ketosulfone, β-sulfonylsulfone, α-diazo compounds of these compounds, and others.

Examples of sulfonate compounds include, but are not limited to, alkyl sulfonate, alkylimide sulfonate, haloalkyl sulfonate, aryl sulfonate, imino sulfonate, and others.

The photo-acid generator (C) may be used either individually or in combination of two or more. The preferred acid generators are sulfonated salts, in particular sulfonated salts with perfluorinated methide anions. The amount of (C) in the resist composition is typically in the range of 0.1 to 8 parts by weight based on 100 parts of (B), alternatively 2 to 5 parts by weight.

Component (D) in the composition is an organic solvent. The choice of solvent is governed by many factors such as the solubility and miscibility of the hydrogen silsesquioxane resin, acid dissociable-group containing compound and photo-acid generator, the coating process and safety and environmental regulations. Typical solvents include ether-, ester-, hydroxyl- and ketone-containing compounds, and mixtures thereof. Examples of solvents include, but are not limited to, cyclopentanone, cyclohexanone, lactate esters such as ethyl lactate, alkylene glycol alkyl ethers such as ethylene glycol methyl ether, dialkylene glycol dialkyl ethers such as diethylene glycol dimethyl ether, alkylene glycol alkyl ether esters such as propylene glycol methyl ether acetate, alkylene glycol ether esters such as ethylene glycol ether actetate, alkylene glycol monoalkyl esters such as methyl cellosolve, butyl acetate, 2-ethoxyethanol, and ethyl 3-ethoxypropionate. Typically, solvents for silsesquioxane resins include, but are not limited to cyclopentanone (CP), propylene glycol methyl ether acetate (PGMEA), ethyl lactate (EL), methyl isobutyl ketone (MIBK), methyl ethyl ketone (MEK), ethyl 3-tethoxypropionate, 2-heptanone or methyl n-amyl ketone (MAK), and/or any their mixtures.

The amount of solvent is typically present at 10 to 95 wt % of the total composition (i.e. (A), (B), (C), (D) and (E)), alternatively, 80 to 95 wt %.

Additives (E) may be optionally used in the photoresist composition. For example, if the photoresist is a positive photoresist, then the photoresist composition may include acid-diffusion controllers, surfactants, dissolution inhibitors, cross-linking agents, sensitizers, halation inhibitors, adhesion promoters, storage stabilizers, anti-foaming agents, coating aids, plasticizers, among others. Typically, the sum of all additives (not including the acid generator) will comprise less than 20 percent of the solids included in the photoresist composition, alternatively less than 5 percent.

Another embodiment of the instant invention is a process for generating a resist image on a substrate. The process comprises the steps of: (a) coating a substrate with a film comprising the resist composition of the present invention; (b) imagewise exposing the film to radiation to produce an exposed film; and (c) developing the exposed film to produce an image.

Step (a) involves coating the substrate with a resist film comprising the resist composition. Suitable substrates are ceramic, metallic or semiconductive, and preferred substrates are silicon-containing, including, for example, silicon dioxide, silicon nitride, silicon oxynitride, silicone carbide, and silicon oxycarbide. The substrate may or may not be coated with an organic or anti-reflective underlayer prior to deposition of the resist composition. Alternatively, a bilayer substrate may be employed wherein a photoresist composition of the invention forms an upper photoresist layer (i.e., the imaging layer) on top of a bilayer substrate comprised of a base layer and underlayer that lies between the upper photoresist layer and the base layer. The base layer of the bilayer substrate is comprised of a suitable substrate material, and the underlayer of the bilayer substrate is comprised of a material that is highly absorbing at the imaging wavelength and compatible with the imaging layer. Conventional underlayers include cross-linked poly(4-hydroxystyrene), polyesters, polyacrylates, polymethacrylates, fluorinated polymers, cyclic-olefin polymers and the like including diazonapthoquinone (DNQ)/novolak resist material.

The surface of the coated or uncoated, single or bilayer substrate is typically cleaned by standard procedures before the resist film is deposited thereon. The resist film can be coated on the substrate using techniques known in the art, such as spin or spray coating, or doctor blading. Typically, the resist film is dried before the resist film is exposed to radiation, by heating to a temperature in the range of 30° C. to 200° C. for a short period of time (e.g. 20 to 90 seconds), typically on the order of approximately 1.0 minute. The resulting dried film has a thickness of 0.01 to 5.0 microns, alternatively 0.02 to 2.5 microns, alternatively 0.05 to 1.0 microns, and alternatively 0.10 to 0.20 microns.

The resist film is then (b) imagewise exposed to radiation, i.e., UV, X-ray, e-beam, EUV, or the like. Typically, ultraviolet radiation having a wavelength of 157 nm to 365 nm is used alternatively ultraviolet radiation having a wavelength of 157 nm or 193 nm is used. Suitable radiation sources include mercury, mercury/xenon, and xenon lamps. The preferred radiation source is a KrF excimer laser or a $F_2$ excimer laser. At longer wavelength radiation is used, e.g., 365 nm, it is suggested to add a sensitizer to the photoresist composition to enhance absorption of the radiation. Full exposure of the photoresist composition is typically achieved with less than 100 mJ/cm$^2$ of radiation, alternatively with less than 50 mJ/cm$^2$ of radiation.

Upon exposure to radiation, the radiation is absorbed by the acid generator in the photoresist composition to generate free acid. When the photoresist composition is a positive photoresist, upon heating, the free acid causes cleavage of the acid dissociable groups that are present in the photoresist composition. When the photoresist composition is a negative photoresist, the free acid causes the crosslinking agents to react with the silsesquioxane resin, thereby forming insoluble areas of exposed photoresist. After the photoresist composition has been exposed to radiation, the photoresist composition is typically heated to a temperature in the range of 30° C. to 200° C. for a short period of time, on the order of approximately 1 minute.

The exposed film is (c) developed with a suitable developer solution to produce an image. Suitable developer solutions typically contain an aqueous base solution, preferably an aqueous base solution without metal ions, and optionally an organic solvent. One skilled in the art will be able to select the appropriate developer solution. Standard industry developer solutions contain bases such as tetramethylammonium hydroxide (TMAH), choline, sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, pyrrole, piperidine, 1,8-diazabicyclo-[5.4.0]-7-undecene, and 1,5-diaza bicyclo-[4.3.0]-5-nonene. In positive photoresist applications, the exposed areas of the photoresist will be soluble, leaving behind the unexposed areas. In negative photoresist, the converse is true, i.e., the unexposed regions will be soluble to the developer while the exposed regions will remain. After the exposed film has been developed, the remaining resist film ("pattern") is typically washed with water to remove any residual developer solution.

The pattern may then be transferred to the material of the underlying substrate. In coated or bilayer photoresists, this will involve transferring the pattern through the coating that may be present and through the underlayer onto the base layer. In single layer photoresists the transfer will be made directly to the substrate. Typically, the pattern is transferred by etching with reactive ions such as oxygen, plasma, and/or oxygen/sulfurdioxide plasma. Suitable plasma tools include, but are not limited to, electron cyclotron resonance (ECR), helicon, inductively coupled plasma, (ICP) and transmission-coupled plasma (TCP) system. Etching techniques are well known in the art and one skilled in the art will be familiar with the various commercially available etching equipments.

Thus, the photoresist compositions of the invention can be used to create patterned material layer structures such as metal wiring lines, contact holes or vias, insulation sections (e.g., damascene trenches or shallow trench isolation), trenches for capacitor structures, etc. as might be used in the design of integrated circuit devices. Such processes for making these features are known in the art.

The following examples are presented to further illustrate the invention, but should not be construed as limiting the invention. Although efforts have been made to ensure the accuracy with respect to numbers, some errors and possible deviations should be accounted for. Percentage is usually by weight, temperature is in ° C., and pressure is at atmosphere, unless indicated otherwise. All the chemicals used here were obtained either through a commercial vender or synthesized with known structure characterized to the best knowledge of the inventors. All NMR (1H, 13C, 19F, 29Si) data were acquired either on Varian Mercury 300 or Mercury 400 spectrometers.

EXAMPLES

Example 1

Hydrogen Silsesquioxane Resin (HSQ) Synthesis 100 grams of toluenesulfonic acid monohydrate (TSAM) solution (prepared by sulfonating toluene at 60° C. using concentrated $H_2SO_4$ and fume $SO_3$) was added into a flask. 10 grams (0.075 mole) of trichlorosilane in 50 grams of toluene was added dropwise into the flask with consistent vigorous stirring. After the addition, the mixture was washed at least 3 times with deionized (DI) water, and the organic phase was collected. Then the solvent was stripped off with a rotary evaporator under reduced pressure to give a hydrogen silsesquioxane resin. The white solid was further dried in a vacuum oven at ambient temperature for overnight.

Example 2

Synthesis of Poly(t-Butyl Methacrylate) (PTBMA) using BPO 270 g of toluene, 38 g of t-butyl Methacrylate and 0.93 g of benzoyl peroxide (BPO) were added into a flask. The mixture was stirred and heated to reflux. After 36 hrs of reflux, the solvent was removed with a rotary evaporator and the solid was further dried in a vacuum oven at 40° C. for overnight. A white resin having Mw of 8,900 in a yield of 70% was obtained.

Example 3

Synthesis of Poly(t-Butyl Methacrylate) (PTBMA) using AIBN 28 g of tetrahydrofuran (THF), 28.4 g of t-Butyl Methacrylate and 0.42 g of 2,2'-azobisisobutyronitrile (AIBN) were added to a flask The mixture was stirred and heated to reflux. After 12 hrs reflux, the viscous solid product was dissolved in 60 g of THF. Solvent was removed in a rotary evaporator and the solid was further dried in a vacuum oven at 40° C. for overnight. A white resin having a Mw of 54,800 in a yield of 92% was obtained.

Example 4

Synthesis of Poly(t-Butoxycarbonyl Norbornyl Silsesquioxane) (PTBNBSQ)

300 g of toluene, 120 g of ethylene glycol dimethyl ether (EGDME), 32.4 g of water and 0.70 mol of diethylamine (DEA) were added to a flask. The mixture was stirred and cooled to −10° C. before adding a mixture of 65.9 g of 5-(2-t-butoxycarbonyl)norbornyltrichlorosilane (TBNBTCS) and 160 g of toluene over a period of 2 hours. After all TBNBTCS was added the solution was stirred at room temperature for 2 hours. The solution was neutralized with acetic acid and washed several times with deionized water (DI). The organic phase was collected. Then 0.91 g of tetra-methyl ammonium hydroxide pentahydrate (TMAHPH) was added to the organic phase and the mixture was stirred and heated to reflux for 12 hrs. The solution was cooled and neutralized with 1 g of acetic acid and washed several times with DI water. Solvent was removed with a rotary evaporator and the solid was further dried in vacuum at 80° C. A white solid resin in 95% yield was obtained. The $Si^{29}$ NMR showed that the product contains about 10 mol % silanol.

Example 5

Synthesis of Poly(t-Butoxycarbonyl Norbornyl Silsesquioxane) (t-BENBSQ)

326 g of toluene, 259 g of water, 326 g of ethylene glycol dimethylether (EGDME) and 184 g of diethylamine were added to a reactor. The mixture was cooled to below 0° C. While stirring, a solution of 237 g of 5-(2-t-butoxycarbonyl) norbornyltrichlorosilane (TBNBTCS) in 474 g of toluene was added into the above cool mixture in about 2 h. After addition was complete, the mixture was raised to room temperature in about 1 h and kept at this temperature for 2 h. Then, 23.7 g of acetic acid was added to the mixture to neutralize the remaining base. Subsequently, the lower aqueous layer was removed and the organic layer was washed with deionized water (3×180 ml). The washed organic solution was transferred to a flask. A 7.6 g of tetramethylammonium hydroxide pentahydrate (TMAHPH) aqueous solution (TMAHPH (3.8 g)/$H_2O$ (3.8 g)) was added. The solution was heated to 105° C. in 2 h. After it was further refluxed for 12 h, the solution was cooled down to room temperature. Then, 12 g of acetic acid was added into the solution. The solution was washed with deionized water (3×120 ml). The solvent was removed from the organic solution by rotary evaporation and the product dried in a vacuum oven at 80° C. for overnight. 29Si NMR showed that the product contains less than 2 mol % residual silanol.

Example 6

Synthesis of Poly(Methyl-co-t-Butoxycarbonyl Norbornyl)Silsesquioxane 100 g of toluene, 30 g of ethylene glycol dimethyl ether (EGDME), 22.5 g of water and 16.38 g of diethylamine (DEA) were added to a flask. The mixture was stirred and cooled to −10° C. before adding a mixture of 17 g of 5-(2-t-butoxycarbonyl)norbornyltrichlorosilane ((TBNBTCS)), 1.86 g of methyltrichlorosilane (MTCS) and 55 g of toluene over a period of 2 hours. After addition was completed the solution was stirred at room temperature for 2 hours. The solution was neutralized with acetic acid and washed several times with deionized water (DI). The organic phase was collected. Then 0.29 g of tetra-methyl ammonium hydroxide pentahydrate was added to the organic phase and the mixture was stirred and heated to reflux for 12 hrs. The solution was cooled and neutralized with 1 g of acetic acid and washed several times with DI water. Solvent was removed with rotary evaporator and the solid was further dried in a vacuum oven at 80° C. for overnight. A white solid resin in 96% yield was obtained.

Example 7

Blend OF HSQ and PTBMA

A blend of 1.04 g of hydrogen silesquioxane polymer prepared in Example 1 and 1.2 g of PTBMA prepared in Example 2 were dissolved in 20.2 g of propylene glycol methyl ether acetate (PGMEA). The solution was filtered through 0.1 μm syringe filter, and then spin-coated onto a 4" silicon wafer. The coated wafer was baked at 130° C. for 60 seconds. The Si wafer with thin film was tested for thinning and developed with 0.263 N tetra-methyl ammonium hydroxide (TMAH) (MF CD26 from Shipley) for 30 seconds before hot plate bake for 90 seconds at 130° C. The thickness of the film before and after TMAH thinning test was measured. Above 97% film retention was obtained for this blend formulation. A thin film of this blend formulated with PAG was exposed to UV light for a few seconds and post exposure baked at 110° C. for 60 seconds before development in 0.263 N tetra-methyl ammonium hydroxide (TMAH) (MF CD26 from Shipley) that resulted in complete removal of the film.

Example 8

Blend OF HSQ and PTBMA

A blend of 1.04 g of hydrogen silsesquioxane polymer prepared in Example 1 and 1.2 g of PTBMA prepared in Example 3 were dissolved in 20.2 g of propylene glycol methyl ether acetate (PGMEA). The solution was filtered through 0.1 μm syringe filter, and then spin-coated onto a 4" silicon wafer. The coated wafer was baked at 130° C. for 60 seconds. The Si wafer with thin film was developed with 0.263 N tetra-methyl ammonium hydroxide (TMAH) (MF CD26 from Shipley) for 30 seconds before hot plate bake for 90 seconds at 130° C. The thickness of the film before and after TMAH thinning test was measured. Above 98% film retention was obtained for this blend formulation. A thin film of this blend formulated with PAG was exposed to UV light for a few seconds and post exposure baked at 110° C. for 60 seconds before development in 0.263 N tetra-methyl ammonium hydroxide (TMAH) (MF CD26 from Shipley) that resulted in complete removal of the film.

Example 9

Blend OF HSQ and Poly(t-Butoxycarbonyl Norbornyl Silsesquioxane) (t-BENBSQ)

A blend of hydrogen silsesquioxane polymer prepared in Example 1 and Poly(t-Butoxycarbonyl Norbornyl Silsesquioxane) (t-BENBSQ) prepared in Example 4 were formulated in PGMEA. The solution was filtered through 0.1 μm syringe filter, and then spin-coated onto a 4" silicon wafer. The coated wafer was baked at 130° C. for 60 seconds. The Si wafer with thin film was developed with 0.263 N tetra-methyl ammonium hydroxide (TMAH) (MF CD26 from Shipley) for 30 seconds before hot plate bake for 90 seconds at 130° C. The thickness of the film before and after TMAH thinning test was measured. Above 98% film retention was obtained for this blend formulation. A thin film of this blend formulated with PAG was exposed to UV light for a few seconds and post exposure baked at 110° C. for 60 seconds before development in 0.263 N tetra-methyl ammonium hydroxide (TMAH) (MF CD26 from Shipley) that resulted in complete removal of the film.

Example 10

Blend OF HSQ and Poly(Methyl-co-t-Butoxycarbonyl Norbornyl)Silsesquioxane

A blend of hydrogen silsesquioxane polymer prepared in Example 1 and Poly(methyl-co-t-butyl norbornene ester) silsesquioxane (T(Me)T(B)) prepared in Example 6 were formulated in PGMEA. The solution was filtered through 0.1-micron syringe filter, and then spin-coated onto a 4" silicon wafer. The coated wafer was baked at 130° C. for 60 seconds. The Si wafer with thin film was developed with 0.263 N tetra-methyl ammonium hydroxide (TMAH) (MF CD26 from Shipley) for 30 seconds before hot plate bake for 90 seconds at 130° C. The thickness of the film before and after TMAH thinning test was measured. Above 98% film retention was obtained for this blend formulation. A thin film of this blend formulated with PAG was exposed to UV light for a few seconds and post exposure baked at 110° C. for 60 seconds before development in 0.263 N tetra-methyl ammonium hydroxide (TMAH) (MF CD26 from Shipley) that resulted in complete removal of the film

The invention claimed is:

1. A resist composition consisting of (A) a hydrogen silsesquioxane resin having the formula

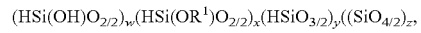

where $R^1$ is a linear or branched $C_1$ to $C_6$ alkyl or alkoxy group; w=0 to 1, x=0 to 1, y is >0 to 1,z is 0 to 1 and w+x+y+z≈1, (B) an acid dissociable group-containing compound, (C) a photo-acid generator, (D) an organic solvent, and optionally (E) an additive.

2. The resist composition as claimed in claim 1 wherein the hydrogen silsesquioxane resin has a molecular weight of 1,000 to 50,000.

3. The resist composition as claimed in claim 1 wherein the acid dissociable groups in (B) have the formula

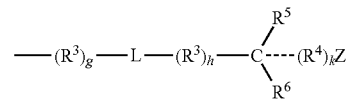

wherein each $R^3$ are independently a linking group;
$R^4$ a second linking group;
L is selected from the group consisting of linear or branch alkylene groups having 1 to 10 carbon atoms, fluoroalkylene groups having 2 to 20 carbon atoms, substituted and unsubstituted arylene groups, substituted and unsubstituted cycloalkylene groups, and substituted and unsubstituted alkarylene groups;
$R^5$ is hydrogen, linear or branched alkyl or fluoroalkyl;
$R^6$ is alkyl or fluoroalkyl;
Z is an acid-cleavable group; and
g may have a value of 0 or 1 and
h may have the value of 0 or 1; and
k may have the value of 0 or 1.

4. The resist composition as claimed in claim 3 wherein Z is selected from —OH, —COOH, esters of the formula —COOR$^7$, carbonates of the formula —OCOOR$^8$, ethers of the formula —OR$^9$, wherein $R^7$, $R^8$ and $R^9$ are selected to render Z acid-cleavable.

5. The resist composition as claimed in claim 3 wherein Z is an ester of the formula —COOR$^7$ and $R^7$ is a tertiary alkyl group.

6. The resist composition as claimed in claim 1 wherein (B) is poly(t-butylmethacrylate).

7. The resist composition as claimed in claim 1 wherein (B) is poly(t-butoxycarbonyl norbornyl silsesquioxane).

8. The resist composition as claimed in claim 1 wherein (B) is poly (methyl-co-t-butoxycarbonyl norbornyl)silsesquioxane.

9. The resist composition as claimed in claim 1 wherein (B) is present in an amount in a range of 20 to 50 parts by weight based on 100 parts by weight of (A).

10. The resist composition as claimed in claim 1 wherein (C) is selected from onium salts, halogen-containing compounds, diazoketone compounds, sulfone compounds, sulfonate compounds.

11. The resist composition as claimed in claim 10 wherein the acid generator is a sulfonate compound.

12. The resist composition as claimed in claim 1 wherein the photo-acid generator is present in an amount in a range of 2 to 5 parts by weight based on 100 parts by weight of (B).

13. The resist composition as claimed in claim 1 wherein there is additionally present (E) at least one additive selected from acid-diffusion controllers, surfactants, dissolution inhibitors, cross-linking agents, sensitizers, halation inhibitors, adhesion promoters, storage stabilizers, anti-foaming agents, coating aids, and plasticizers.

14. The resist composition as claimed in claim 13 wherein (E) is present in amount of less than 20 wt % based on solids.

15. The resist composition as claimed in claim 1 wherein (D) is selected from ether-, ester-, hydroxyl- and ketone-containing compounds.

16. The resist composition as claimed in claim 15 wherein (D) is present in an amount of 80 to 90 wt % based on the weight of the total photoresist composition.

17. A process for generating a resist image on a substrate comprising
   (a) coating a substrate with a film comprising the resist composition as claimed in claim 1;
   (b) imagewise exposing the film to radiation to produce an exposed film; and
   (c) developing the exposed film to produce an image.

18. The process as claimed in claim 17 wherein the film is coated on the substrate by spin-coating.

19. The process as claimed in claim 17 wherein the film is dried before exposure to the radiation.

20. The process as claimed in claim 17 wherein the exposed film has a thickness of 0.01 to 5 microns.

21. The process as claimed in claim 17 wherein the radiation is selected from UV, X-ray, e-beam and EUV.

22. The process as claimed in claim 17 wherein the radiation has a wavelength in the range of 157 nm to 365 nm.

23. The process as claimed in claim 17 wherein the radiation has a wavelength in the range of 157 nm to 193 nm.

24. The process as claimed in claim 17 wherein the exposed film is heated at a temperature of 30° C. to 200° C. prior to being developed.

25. The process as claimed in claim 17 wherein the exposed film is developed by contacting the exposed film with an aqueous base solution.

* * * * *